US007184454B2

(12) United States Patent
Guenter

(10) Patent No.: US 7,184,454 B2
(45) Date of Patent: Feb. 27, 2007

(54) LIGHT EMITTING DEVICE WITH AN INTEGRATED MONITOR PHOTODIODE

(75) Inventor: James Guenter, Garland, TX (US)

(73) Assignee: Finisar Corporation, Sunnyvale, CA (US)

(*) Notice: Subject to any disclaimer, the term of this patent is extended or adjusted under 35 U.S.C. 154(b) by 95 days.

(21) Appl. No.: 10/877,915

(22) Filed: Jun. 25, 2004

(65) Prior Publication Data

US 2005/0286593 A1 Dec. 29, 2005

(51) Int. Cl.
*H01H 5/00* (2006.01)

(52) U.S. Cl. .................................. 372/50.21; 372/50.1

(58) Field of Classification Search ............... 372/43.1, 372/50.1, 50.21

See application file for complete search history.

(56) References Cited

U.S. PATENT DOCUMENTS

| | | | | |
|---|---|---|---|---|
| 5,365,536 | A * | 11/1994 | Seki | 372/45.01 |
| 5,475,701 | A * | 12/1995 | Hibbs-Brenner | 372/50.124 |
| 5,625,636 | A | 4/1997 | Bryan et al. | |
| 5,751,754 | A * | 5/1998 | Takagi | 372/46.01 |
| 5,978,401 | A | 11/1999 | Morgan | |
| 6,487,230 | B1 * | 11/2002 | Boucart et al. | 372/96 |
| 6,707,027 | B2 | 3/2004 | Liess et al. | |
| 6,717,972 | B2 * | 4/2004 | Steinle et al. | 372/50.21 |
| 6,845,118 | B1 * | 1/2005 | Scott | 372/96 |
| 2001/0043629 | A1 * | 11/2001 | Sun et al. | 372/43 |
| 2002/0071464 | A1 * | 6/2002 | Coldren et al. | 372/45 |
| 2002/0110172 | A1 * | 8/2002 | Hasnain et al. | 372/45 |
| 2005/0286593 | A1 * | 12/2005 | Guenter | 372/50.21 |

FOREIGN PATENT DOCUMENTS

| | | | |
|---|---|---|---|
| WO | WO 02/37124 | 5/2002 | 3/36 |
| WO | WO 02/37410 | 5/2002 | 11/8 |
| WO | WO 02/37411 | 5/2002 | 11/8 |

* cited by examiner

*Primary Examiner*—Minsun Oh Harvey
*Assistant Examiner*—Phillip Nguyen
(74) *Attorney, Agent, or Firm*—Workman Nydegger

(57) ABSTRACT

A monolithically formed laser and photodiode. The monolithically formed laser and photodiode includes a Vertical Cavity Surface Emitting Laser (VCSEL) that includes a first PN junction. The first PN junction includes a first p layer and a first n layer. A tunnel diode is connected to the VCSEL both physically and electronically through a wafer fabrication process. A photodiode is connected to the tunnel diode. The photodiode is connected to the tunnel diode by physical and electronic connections. The tunnel diode and photodiode may share some common layers. The tunnel diode includes a second PN junction. The monolithically formed laser and photodiode allow for an integrated structure with diode biasing flexibility including the use of a single supply to bias both the laser and photodiodes.

20 Claims, 6 Drawing Sheets

100 101 102 104 106 108 111 110 112 114 118 116

LIGHT EMITTING DEVICE WITH AN INTEGRATED MONITOR PHOTODIODE

BACKGROUND OF THE INVENTION

1. The Field of the Invention

The invention generally relates to vertical cavity surface emitting lasers. More specifically, the invention relates to using photodiodes in conjunction with vertical cavity surface emitting lasers.

2. Description of the Related Art

Lasers have become useful devices with applications ranging from simple laser pointers that output a laser beam for directing attention, to high-speed modulated lasers useful for transmitting high-speed digital data over long distances. Several different types of lasers exist and find usefulness in applications at the present time. One type of laser is the edge emitter laser which is formed by cleaving a diode from a semiconductor wafer. Cleaving a diode from a semiconductor wafer forms mirrors that form a laser cavity defined by the edges of the laser diode. Edge emitter lasers may be designed to emit a laser beam more strongly from one of the edges than the other edges. However, some laser energy will be emitted at the other edges. Edge emitter lasers are commonly used when high optical power is needed.

A second type of commonly used laser is known as a vertical cavity surface emitting laser (VCSEL). A VCSEL is formed in part by forming a first mirror from Distributed Bragg Reflector (DBR) semiconductor layers. The DBR layers alternate high and low refractive indices so as to create the mirror effect. An active layer is then formed on the first mirror. A second mirror is formed on the active layer using more DBR semiconductor layers. Thus the VCSEL laser cavity is defined by top and bottom mirrors which causes a laser beam to be emitted from the surface of the laser. Laser diodes generally operate using a forward bias. To forward bias a laser diode, a voltage is applied to the anode and a lower voltage or ground is connected to the cathode.

In some simple applications, the lasers may be operated open loop. I.e., the lasers do not require feedback, or can operate satisfactorily without feedback. For example, in most laser pointer applications, the output power of the laser beam may be controlled without reference to the actual output power. In other applications, it may be very important to precisely gauge the amount of actual output power emitted by the laser while it is operating. For example, in communications applications it may be useful to know the actual output power of the laser such that the output power of a laser may be adjusted to comply with various standards or other requirements.

Many applications use a laser in combination with a photodiode or other photosensitive device to control the output of the laser. A photodiode has current characteristics that change as light impinges the diode. The photodiode either has no bias or is implemented in a reverse bias configuration such that the cathode is connected to a high voltage while the anode is connected to a low voltage or ground. In a photodiode in the reverse biased or unbiased configuration, current is generated within the photodiode as light impinges the photodiode. An appropriately placed photodiode may be used as one element in the feedback circuit for controlling the laser. For example, a photodiode used in an edge emitter laser application may be placed on one of the edges of the edge emitter laser diode. While the power output at each of the edges may be different, the power at each of the edges is proportional by some factor to the power output at the other edges on in edge emitter laser diode. Similarly, the photodiode may be used to monitor the output power from other types of lasers.

Various challenges exist when implementing a laser diode and photodiode together. While the laser diode and photodiode share a similar construction and composition, they have generally been implemented as separate devices. This allows a single power supply to be used for both biasing the laser diode and photodiode which are biased using opposite polarities. Using two discrete components, however, results in an increase of cost.

Attempts have been made to integrate the laser diode and photodiode monolithically on a single wafer substrate. However, as mentioned above, this may require the use of two power supplies such as in the case when the laser diode and photodiode share a common cathode or anode. Additionally, the photodiode may be placed on top of the VCSEL or within a mirror that is part of the VCSEL. This however has the unfortunate drawback of causing the photodiode to become a part of the optics, particularly the mirror, of the laser thus altering the optical characteristics of the laser.

Therefore, what would be advantageous are mechanisms for implementing laser diodes and photodiodes monolithically where a single power supply can be used.

BRIEF SUMMARY OF THE INVENTION

One embodiment of the invention includes an optoelectronic device that combines a laser diode and photodiode monolithically. The optoelectronic device includes a VCSEL diode that includes a first PN junction. The first PN junction includes a first p layer and a first n layer. A tunnel diode is connected to the VCSEL diode monolithically. The tunnel diode includes a heavily doped n+ layer and a heavily doped p+ layer. A photodiode is monolithically connected to the tunnel diode. The photodiode includes a second PN junction. The second PN junction may include one of the heavily doped p+ and n+ layers of the tunnel diode depending on other features of the optoelectronic device.

Another embodiment of the invention includes a method for making optoelectronic devices such as monolithically formed laser diodes and photodiodes. The method includes forming a photodiode on a wafer. A tunnel diode is then formed on the photodiode, where the tunnel diode is electrically connected to the photodiode. A VCSEL diode is then formed on the tunnel diode, where the VCSEL diode is electrically connected to the tunnel diode.

Some embodiments of the invention may include other features such as optimizations for use in self mixing applications. By increasing a laser diodes susceptibility to light reflections and by allowing laser wavelength to be controlled using a bias current, a self mixing optoelectronic device can be created. These devices may be used in creating various devices such us cursor pointers, imaging devices, linear measurement devices and the like.

Some embodiments of the invention allow for a single structure that includes both a laser diode and a photodiode. Further, because of the particular construction of these embodiments, a single power supply, as opposed to a positive and negative supply, can be used to power both laser diode and photodiode biasing circuits.

These and other advantages and features of the present invention will become more fully apparent from the following description and appended claims, or may be learned by the practice of the invention as set forth hereinafter.

BRIEF DESCRIPTION OF THE SEVERAL VIEWS OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF EMBODIMENTS THE INVENTION

Some exemplary embodiments of the present invention include monolithically formed laser diodes and photodiodes. The laser diodes and photodiodes are connected through tunnel diodes such that a single power supply may be used to power the laser diodes and photodiodes. Appropriate contacts are formed to allow access to the various junctions of the laser diodes, tunnel diodes, and photodiodes.

Figure 1:
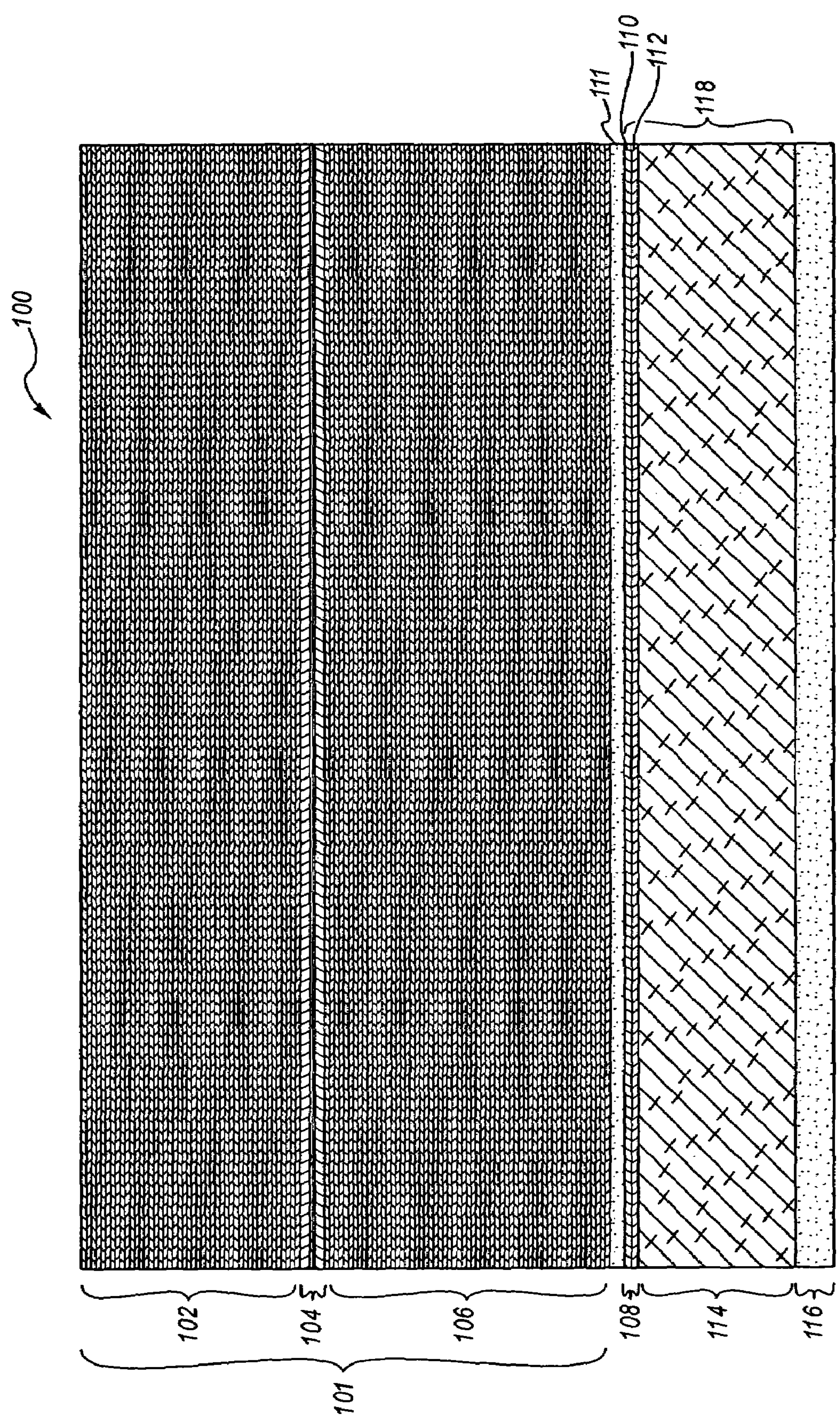
FIG. 1 illustrates an epitaxial structure including a laser diode, a tunnel diode and photodiode.

Referring now to FIG. 1, an example of an optoelectronic device including an epitaxial structure 100 that includes layers formed on a wafer substrate is shown. In one embodiment, the structure 100 is grown using a GaAs wafer. However, other III–V (three-five) semiconductor combinations may also be used. FIG. 1 shows a vertical cavity surface emitting laser (VCSEL) 101. The VCSEL 101 in the example shown includes a top mirror 102, an active region 104, and a bottom mirror 106. A PN junction exists in the active region 104.

A spacer layer 111 is formed below the bottom mirror 106. The spacer layer 111 is preferably about $5\lambda/4$ or $7\lambda/4$ where $\lambda$ is the wavelength of light that the VCSEL 101 is designed to emit. The spacer layer 111 may be any odd integral multiple of the wavelength (i.e., $$\frac{\lambda(1+n)}{4}$$

where n is an integer) that is thick enough to account for non-uniformities that may occur in various layers of the epitaxial structure 100. The spacer layer 111 must be sufficiently thick such that when etching is done to the spacer layer 111 the deepest non-uniformities do not go all the way through the spacer layer and the shallowest potions reach the spacer layer 111. The goal, therefore is to expose the spacer layer 111 without going all the way through the spacer layer 111 at any point. Subsequent processing uses a selective etchant such as dilute hydrofluoric acid to uniformly expose the layer underlying the spacer.

The epitaxial structure 100 further includes a tunnel diode 108, formed on and electrically connected to the VCSEL 101. The tunnel diode 108 includes a heavily doped n+ layer 110 and a heavily doped p+ layer 112.

The epitaxial structure 100 further includes a photodiode, formed on and electrically connected to the tunnel diode 108, that includes a second PN junction that is comprised of the heavily doped p+ layer 112 of the tunnel diode 108 and a lightly doped photodiode n layer 114. An additional p layer (not shown) that is not as heavily doped may also be fabricated between the p+ layer 112 and the photodiode n layer 114. In one embodiment, the epitaxial structure 100 is constructed on an n type substrate 116. Although the substrate 116 is shown in FIG. 1 as a thin layer, the substrate is actually in one embodiment of the invention in the hundreds of microns whereas the epitaxial structure including the photodiode, the tunnel diode 108, and the laser diode 101 is about 10 microns. The epitaxial structure 100 is generally grown using a metal organic chemical vapor phase deposition (MOCVD) process.

The top mirror 102 is a distributed Bragg reflector (DBR) that generally comprises a number of alternating layers with high and low indexes of refraction. This creates a mirror with high reflectivity, around 99.5%. In the example shown, the top mirror is constructed of p type materials such as carbon doped aluminum gallium arsenide (AlGaAs), where the fraction of Al can vary from 0% to 100%. The top mirror 102 includes about 20 mirror periods where each period includes a high index of refraction layer and a low index of refraction layer.

The active region 104 includes a number of quantum wells for stimulating the emission of laser energy. In the embodiment shown, active region 104 is less than 1 micron.

Below the active region is a bottom mirror 106. The bottom mirror is comprised of about 30 to 35 doped n type mirror periods. Silicon is one example of a dopant that may be used in the bottom mirrors.

The tunnel diode 108, as mentioned previously, includes a heavily doped n+ layer 110 and a heavily doped p+ layer 112. To accomplish the heavy doping, it may be desirable to create a super lattice structure. For example, instead of only GaAs layers, it may be desirable to include both layers of GaAs and InGaAs to tailor the bandgap and doping properties to improve the tunnel diode 108. It is also desirable that the tunnel diode 108 be somewhat transparent so as to allow optical energy to pass through to the photodiode layer 114. This may be done in one embodiment by increasing doping on the heavily doped n+ layer 110 so as to increase transparency through the so-called Burstein shift.

It would advantageous to balance the thickness of the heavily doped p+ layer 112 such that appropriate conduction exists through the tunnel diode 108 while maintaining appropriate transparency. Thus, in one embodiment of the invention, the heavily doped p+ layer 112 is about 50 to 100 nanometers and preferably at least $3\times10^{19}$ of p type material (e.g., when used in an 850 nm laser). The heavily doped n+ layer may be nearly any practicable thickness without imposing an optical penalty.

Below the tunnel diode 108 is a photodiode 118. The photodiode 118 should be constructed so as to have an appropriate responsivity to incoming light. Thus, in one embodiment of the invention, the photodiode 118 includes a lightly doped n layer 114 that is approximately three microns or less when the VCSEL 101 is designed to emit an 850 nm wavelength. One embodiment of the invention includes a lightly doped n layer 114 that is about 1.5 microns. Notably, the thickness of the lightly doped n layer 114 can be used to tailor the responsivity and speed of the photodiode.

Figure 2A:
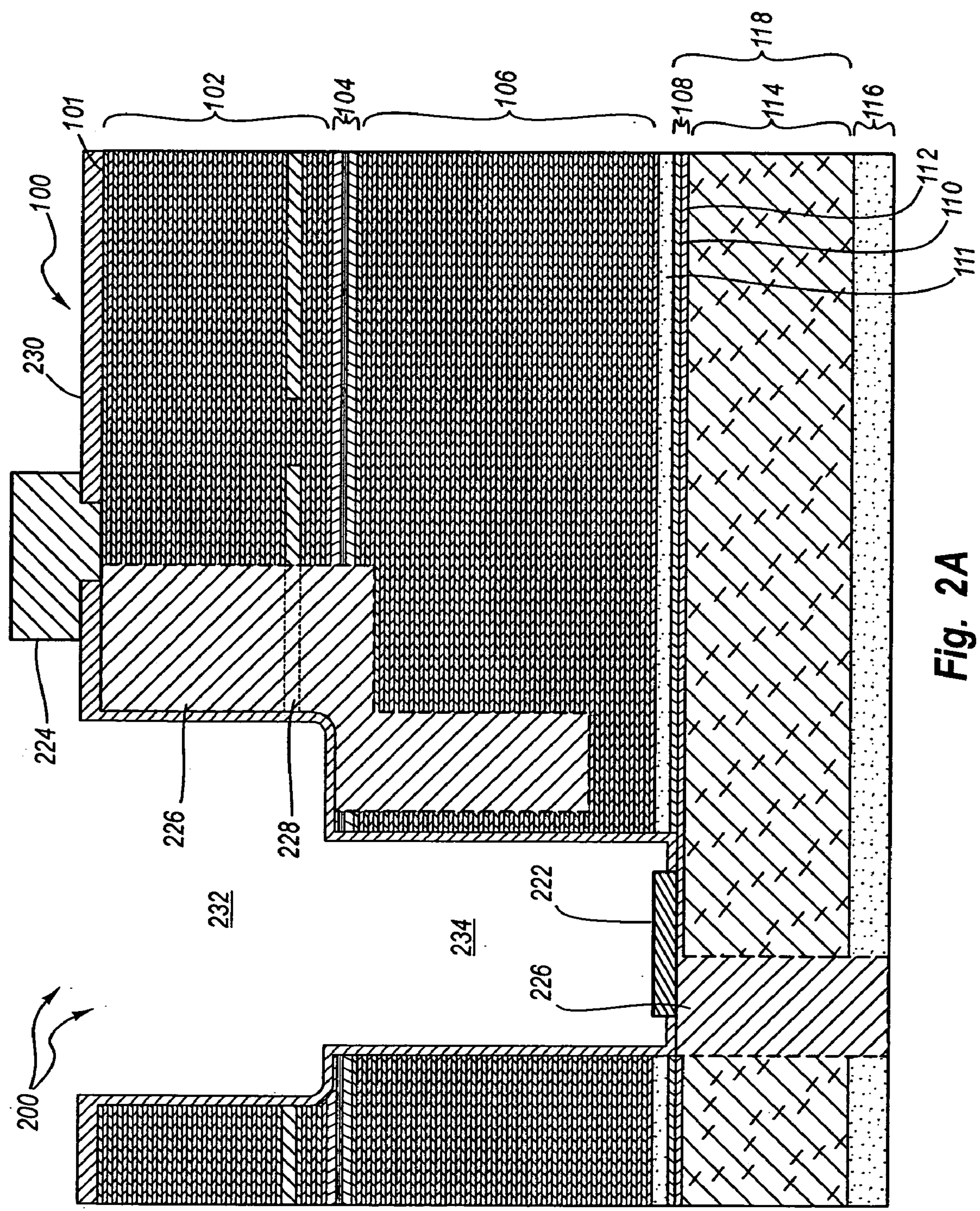
FIG. 2A illustrates a monolithic structure including a laser diode and photodiode, where the monolithic structure also includes photolithographically formed contacts and isolation barriers.

Referring now FIG. 2A, an embodiment is shown where contacts and oxide layers are formed through a photolithographic process. The formation of contacts allows appropriate biasing to be applied to, and signals to be read from the VCSEL 101 and photodiode 118. The lithographic process includes a series of acts where photoresist is applied to the epitaxial layers 100. The photoresist is then exposed lithographically to various patterns. Lithographic exposure allows a pattern of photoresist to remain on the epitaxial layers 100 while the remainder of the photoresist may be washed from the epitaxial layers 100.

The patterns of photoresist that remain on the epitaxial layers 100 block ions from being implanted in the epitaxial layers 100, metal from being deposited on the epitaxial layers 100, and etching solutions from etching portions of the epitaxial layers 100. Thus, using appropriate photolithographic processes a monolithic structure 200 that includes a VCSEL 101, a tunnel diode 108 and a photodiode 118 may be constructed with appropriate contacts and with appropriate isolation from other devices on a wafer being fabricated simultaneously.

In the example shown in FIG. 2A, a tunnel diode contact 222 is formed such that it connects to the heavily doped p layer 112. A VCSEL contact 224 is formed such that it connects to the top mirror 102 of the VCSEL 101. Another contact may be formed on the bottom of the substrate 116 to provide the appropriate contact to the photodiode 118. Isolation barriers 226 are formed to isolate the VCSEL 101 and the photodiode 118 from other devices being formed on the substrate 116. An aperture 228 is oxidized into the top mirror 102. The aperture 228 is used primarily to direct current flow through the VCSEL 101.

More specifically, the optoelectronic device 200 is fabricated from an epitaxial structure 100. The epitaxial structure 100 has a dielectric such as silicon dioxide or silicon nitride grown on it to form a portion of the dielectric layer 230. A shallow trench mask is used to remove portions of the oxide using an etching process. An etch process is used to form the shallow trench 232 in the VCSEL 101. The aperture 228 can then be oxidized into the VCSEL 101.

A deep trench mask can then be used to etch the deep trench 234. An etch can be used to etch down to a thick AlAs spacer 111. This spacer may be AlAs or another AlGaAs composition, so long as the fraction of aluminum is substantially greater than that in the underlying layer. A stop etch may be used to etch through the AlAs spacer 111 to the n+ layer 110. Another etch can be used to etch through the n+ layer 110 to the p+ layer 112. At this point, an additional oxide may be grown that forms additional portions of the dielectric layer 230. Portions of the dielectric layer 230 are removed followed by deposition of metal to form contacts 222, 224 on the optoelectronic device 200.

Figure 2B:
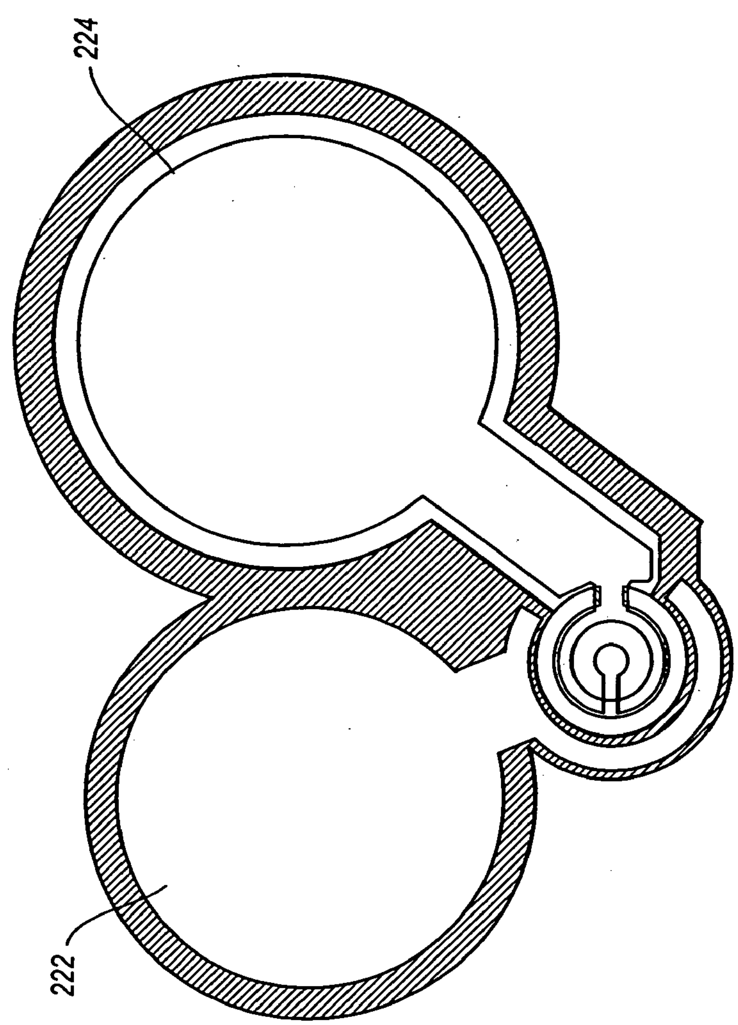
FIG. 2B illustrates a top view of a monolithically formed laser diode and photodiode.

A top view of the optoelectronic device structure and contacts is shown in FIG. 2B. FIG. 2B illustrates the placement of the tunnel diode contact 222 and the VCSEL contact 224. While a single tunnel diode contact 222 is shown, in other embodiments, an additional tunnel diode contact may be formed opposite the tunnel diode contact 222 to provide for additional wire bonding options when packaging the optoelectronic device structure.

Figure 3:
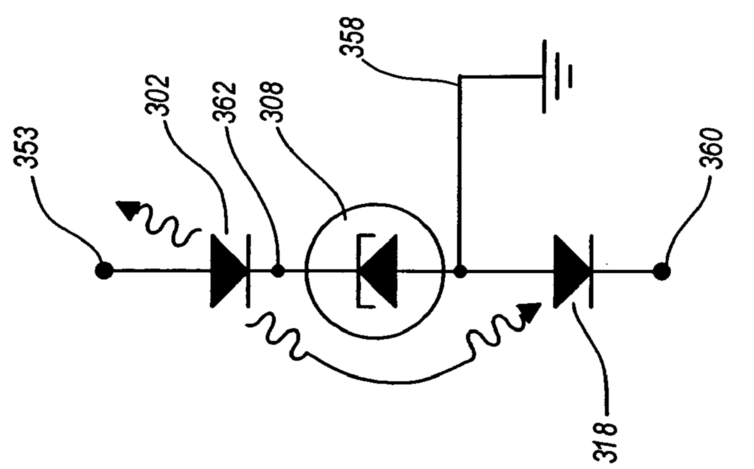
FIG. 3 illustrates a schematic representation of the device shown in FIG. 2A.

Referring now FIG. 3, a schematic diagram illustrating the device of FIG. 2 shown. The schematic 300 of FIG. 3 illustrates a VCSEL diode 302 with a VCSEL contact 353 at the anode of the VCSEL diode 302. The cathode of the VCSEL diode 302 is connected to the cathode of a tunnel diode 308. The tunnel diode 308 anode is connected to the anode of a photodiode 318 at node 362. A tunnel junction contact 358 is available at the anode of the tunnel diode 308 and the anode of the photodiode 318. A photodiode contact 360 is connected to the photodiode 356 cathode. The tunnel junction contact 358 may, in one application be connected to ground. A supply voltage may be connected to the VCSEL contact 353 and the photodiode contact 360. Alternatively, if different voltage levels are desirable for biasing the VCSEL diode 302 and the photodiode 318 one of the voltage levels can be derived from the supply voltage such as by using a boost converter or other voltage converter. In any case, using the particular embodiment illustrated, a single voltage supply source may be used to operate both the VCSEL diode 302 and the photodiode 318.

Figure 4:
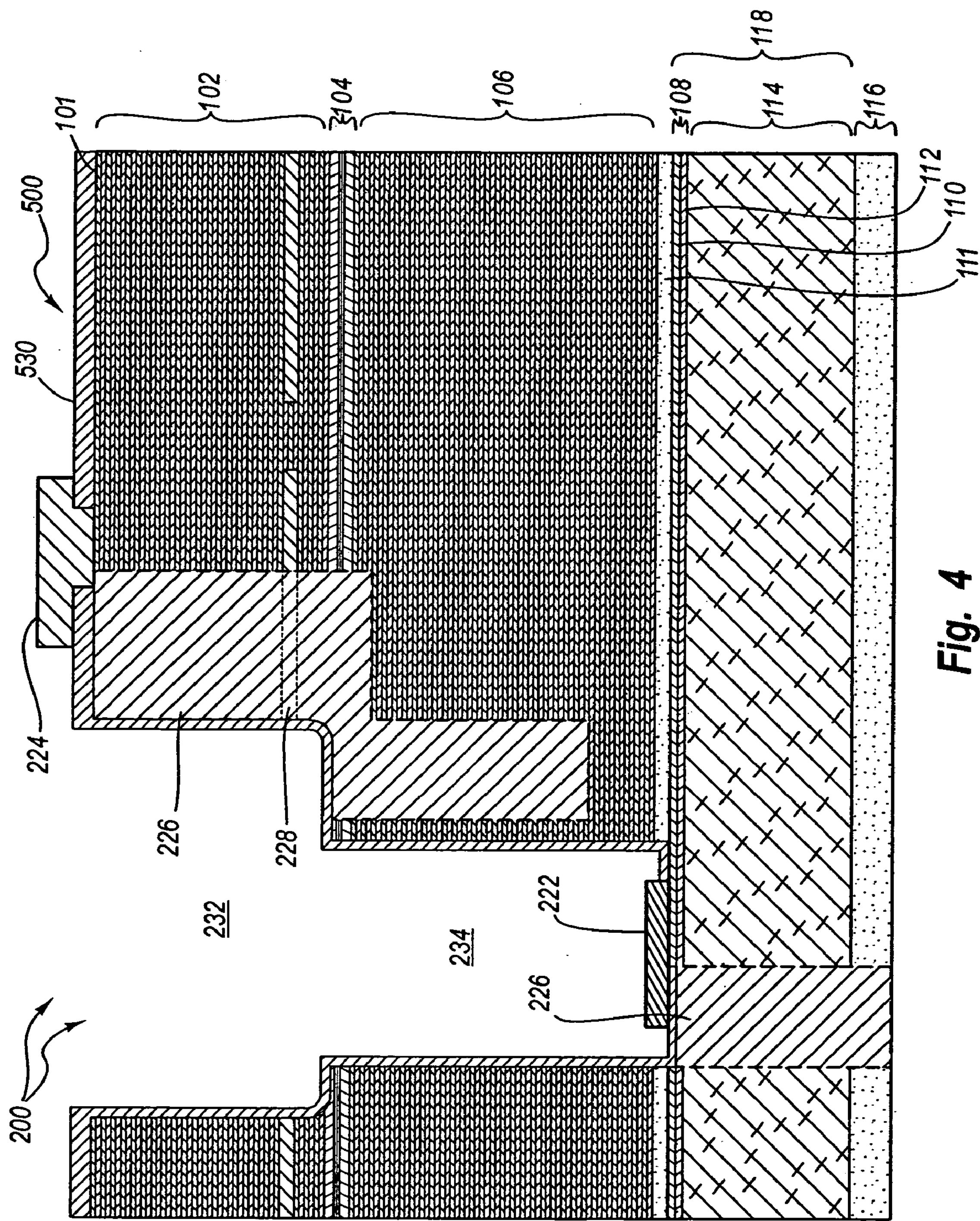
FIG. 4 illustrates a monolithic structure including a laser diode and photodiode connected by a tunnel diode where a contact is connected to the n layer of the tunnel diode.

Other embodiments may also be implemented within the scope of embodiments of the present invention. For example, FIG. 4 illustrates an example where the tunnel diode contact 222 is connected to the heavily doped n+ layer 110 as opposed to the connection to the heavily doped p+ layer 112 as is shown in FIG. 2A. Schematically, this results in the tunnel junction contact 358 shown in FIG. 3 being located between the cathodes (at node 362) of the VCSEL diode 302 and the tunnel diode 308. This may be advantageous in some embodiments as it reduces the amount of current that must pass through the tunnel diode 308.

In the embodiment shown in FIG. 3, the current from the VCSEL diode 302 must also pass through the tunnel diode 308. This current can be quite large compared to the current through the photodiode 318. By placing the tunnel junction contact between the cathodes of the VCSEL diode 302 and the tunnel diode 308 (node 352), only the current passing through the photodiode 318 need pass through the tunnel diode 308. This allows the tunnel diode layers to be minimized so as to maximize their transparency. Various other changes may also be implemented such as reversing the order of the PN junction layers in each of the diodes. Referring once again to FIG. 2A, an optimization of the optoelectronic device 200 that mitigates the effects of spontaneous emissions from the active region 104 will be discussed. The active region has emissions that may not necessarily be at the lasing wavelength, i.e., the wavelength at which the VCSEL 101 is intended to operate. It is desirable to detect just the lasing wavelength at the photodiode 118. To reduce the amount of spontaneous emissions that reach the photodiode 118, layers in the bottom mirror 106 with a high Ga fraction, i.e., the high index of refraction layers, may have the amount of Ga in them optimized such that they become heavily absorbing below the lasing wavelength.

While the above description has been framed in the context of VCSEL diodes, other light generating devices may also be used. For example, a resonant cavity a light emitting diode (RCLED) may be used as a light generating device in place of the VCSEL diodes.

Some embodiments of the invention may find particular usefulness in self mixing laser applications. Self mixing laser applications make use of laser power reflected back into the laser cavity and more especially into the active region. This reflected laser power changes the output of the laser. The output of the laser may be changed such as by changing the wavelength of the laser or by causing the laser output to be modulated in various beat patterns. A change in the wavelength of the laser, however, may be almost undetectably small. Thus the change in the wavelength may be detected as a shift in phase of an optical signal. By continuously monitoring output from the laser, information can be gathered about conditions external to the laser. For example, using appropriate modulation and digital signal processing, information can be gathered about the distance of objects from a laser, movement of objects about the laser and the like. This allows the laser to be used in applications such as imaging, linear measurements, cursor pointers and the like.

The laser output may be modulated by increasing and decreasing the wavelength of the beam output by the laser, for example by changing the temperature of the laser. Thus, if the temperature of the laser can be controlled, the wavelength output from the laser can also be controlled. By modulating the laser wavelength, a chirp, e.g. rising and falling frequencies, can be used in a Doppler effect detector. An integrated photodiode is therefore useful for monitoring laser output power in self mixing applications where a Doppler effect causes a change in the output of the laser.

In some embodiments of the invention, a structure is fabricated to optimize or enhance the effects of reflections, temperature changes and the like. This can be accomplished by optimizing optical characteristics such as by allowing more light to be reflected from outside the laser into the active region. Other optimizations contemplate optimizing the laser to be effected by temperature changes such as by changing the thermal conductivity/resistance or thermal mass characteristics of the laser. Still other optimizations alter the threshold current versus temperature operating characteristics to change the characteristics of the laser by optimizing the linewidth enhancement factor.

Figure 5:
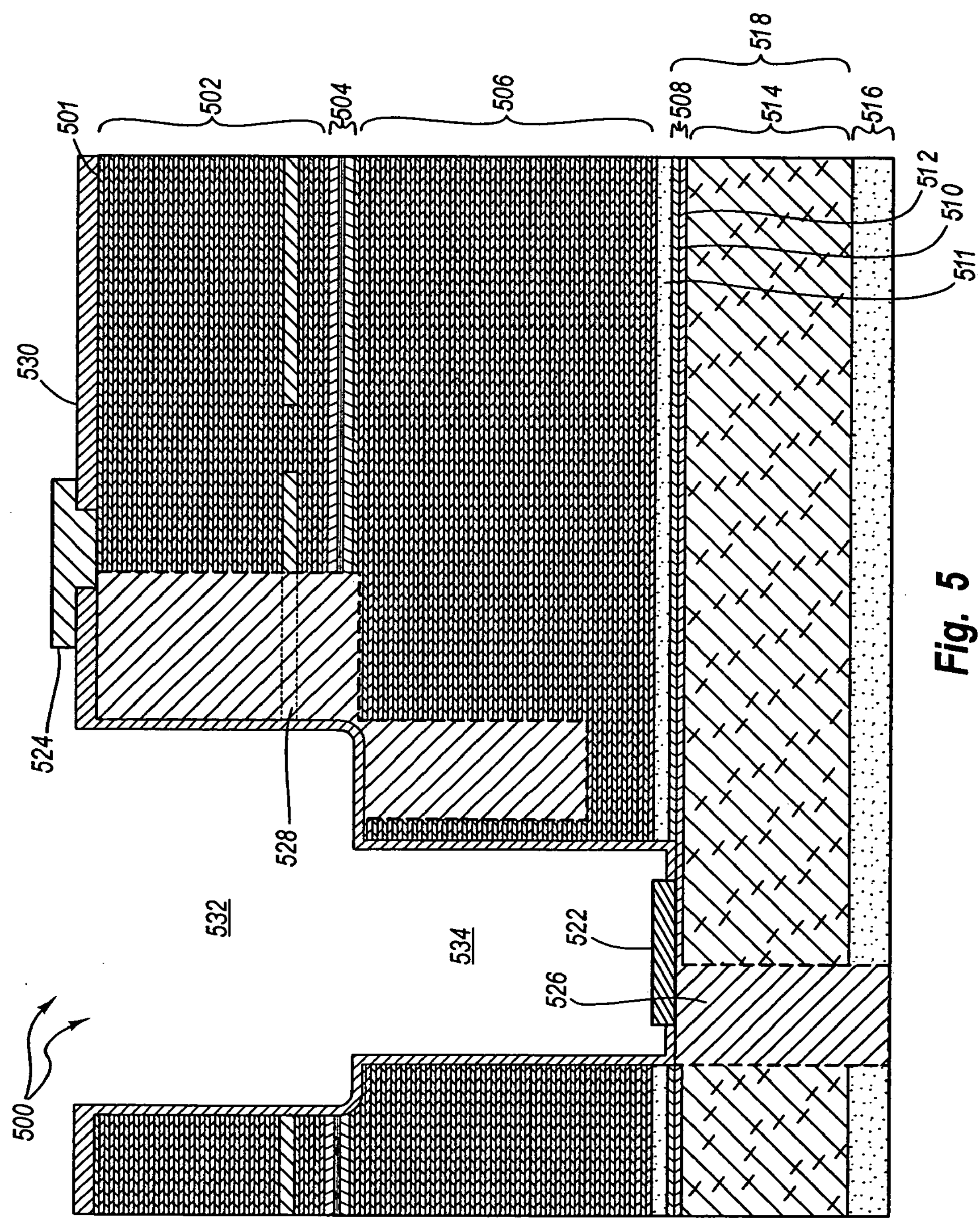
FIG. 5 illustrates a monolithic structure where optimizations are made for lasers used in self mixing applications.

The following optimizations are particularly well suited for self mixing applications. It should therefore be understood that these optimizations are exemplary only, and not required by all embodiments of the invention. In fact, the optimizations used in self mixing applications are often the opposite of optimizations that may be used in other application. For example, while self mixing applications make use of temperature changes and reflections, other applications, such as communications applications, attempt to minimize these and other effects. These optimizations for use in self mixing applications will now be discussed with reference to FIG. 5. While characterized as optimizations, optimize as used herein does not require that the components be optimized to their absolute optimal configuration, but rather that the components be fabricated so as to increase sensitivity to reflections and thermal changes. FIG. 5 illustrates optimizations for self mixing applications to increase the sensitivity of an optoelectronic device to light reflections, temperature changes and the like. FIG. 5 illustrates an optoelectronic device 500 that includes a VCSEL 501 with integrated photodiode.

Optical Characteristic Optimization

One method of increasing the sensitivity of the VCSEL 501 is by fabricating the optoelectronic device 500 to allow more light to be reflected into the active region 504. This may be done by changing the doping levels of the alternating layers in the top mirror 502 to be more lightly doped. This causes the top mirror 502 to be more translucent to light reflected back into the active region 504.

By reducing the doping in the alternating layers of the top mirror 502, electrical resistance is increased. This causes the VCSEL 501 to run at a higher temperature. Thus by reducing the doping in the top mirror 502, sensitivity of the VCSEL 501 is compounded by the combined effects of a more translucent top mirror 502 and increased temperature sensitivity of the VCSEL 501. Temperature sensitivities will be covered in more detail below.

The opaqueness of the VCSEL 501 may also be optimized by appropriately selecting the thickness of a dielectric layer 530 on the top mirror 502. Ordinarily, it is desirable to make the top mirror 502 as reflective as possible. However, in self mixing applications it may be desirable to make the top mirror 502 less reflective and more translucent. To make the top mirror 502 more reflective a dielectric layer 530 is placed on the top mirror where the dielectric layer has a thickness that is nearly some integral multiple of a half wavelength of the wavelength for which the laser is designed. To make the top mirror 502 more translucent, the dielectric layer 530 can be designed such that is a multiple of an odd quarter wavelength. For example, the thickness of the dielectric layer 530 may be selected such that the thickness is $$\frac{2n+1}{4}\lambda$$

where n is an integer and λ is the wavelength of design for the laser. Optimizing the dielectric layer 530 allows for other thicknesses to be used depending on the desired opaqueness of the top mirror 502.

Thermal Characteristic Optimization

Another way of increasing the sensitivity of the VCSEL 501 is by changing the thermal characteristics of the epitaxial layers. More particularly, it may be desirable to increase the sensitivity of the optoelectronic device 500 to temperature variations so as to be able to control modulation of the output wavelength of the VCSEL 501. Optimizations of thermal characteristics may fall into different categories, such as for example, optimizations to thermal impedance and optimizations to thermal mass.

Thermal impedance is a measure of a devices ability to conduct heat. The less able a device is to conduct heat, the quicker the temperature will rise in the device as heat is applied. For example, if a device is less conductive of thermal energy, a given level of current will cause the operating temperature of the device to rise more quickly. This causes a corresponding change in the wavelength at which the device, such as a VCSEL 501, operates.

Thermal mass is a measure of a components temperature rise for a given amount of heat. A greater thermal mass means that the temperature does not increase as rapidly for a given amount of heat and the temperature change occurs more slowly. One way of increasing thermal mass is by increasing the physical mass of the device or by increasing connections to devices capable of dissipating heat. For example, connecting a heatsink, such as a large piece of metal with a large amount of surface area increases the thermal mass. In some embodiments of the invention, such as self mixing applications, it is desirable to reduce the thermal mass to optimize wavelength changes based on current changes in the VCSEL 501.

To make the optoelectronic device 500 more sensitive to temperature variations by decreasing thermal mass, the contacts such as contacts 524, 522 may be optimized by minimizing their physical size to reduce their heatsinking effect. In one embodiment, the contacts are designed to be the minimal size sufficient for carrying an amount of current needed to appropriately bias and power the various diodes in the optoelectronic device 500.

One way of increasing thermal sensitivity in the optoelectronic device 500 by decreasing thermal conductivity is by forming a trench around the active region. This prevents some amount of thermal conduction from heat generating parts of the optoelectronic device 500 to other materials that may provide heatsinking functionality. In one embodiment, forming a trench may be accomplished by optimizing the shallow trench 532 to extend below the active region 504. In the example shown in FIG. 5, by extending the shallow trench 532 below the active region 504, the VCSEL 501 becomes more sensitive to temperature variations.

Another method of optimizing the thermal conductivity of the optoelectronic device including the optoelectronic device 500 is by selecting an appropriate construction of the bottom mirror 506. The mirrors may be formed of layers alternating low and high index of refraction layers. Notable, binary type materials, i.e., those formed from two elements, are more thermally conductive than ternary type materials, i.e., those formed from three elements. In FIG. 5, the high index of refraction layers and low index layers in the bottom mirror 506 are AlGaAs where the Al fraction may be selected from the range from 0% to 100. The lower refractive index layers have a higher Al fraction. By forming a number of ternary layers, such as AlGaAs near the active region and keeping binary layers such as AlAs and GaAs layers, if present, further from the active region, the thermal conductivity can be decreased.

Yet another method of optimizing the thermal conductivity for self mixing applications of the optoelectronic device involves increasing the number of mirror periods in the mirrors 502, 506. This causes a decrease in the thermal conductivity of the VCSEL 501. To maintain an appropriate reflectivity of the mirrors 502, 506, it may be useful to vary the Al/Ga ratio in the individual mirror periods to maintain a total desired reflectivity for all of the mirror periods when combined to form the mirrors 502, 506.

There is some need to balance thermal conductivity and thermal mass so as to preserve the ability to change temperature, and thus wavelength, quickly. Namely, if thermal mass is decreased, the thermal impedance can be increased and if the thermal impedance is increased, the thermal mass can be decreased.

Increasing the electrical impedance of a device generally causes more heat to be generated in the device for a given current. For a constant thermal mass and thermal conductivity, increases in heat generated increases operating temperature. As mentioned above, one way of increasing the electrical impedance is by reducing the doping in the top mirror 502. A similar reduction in the doping in the bottom mirror 506 will have a similar effect.

Another method of optimizing the electrical impedance of the optoelectronic device 500, is by controlling the size of the aperture 528. By oxidizing the aperture 528 further into the VCSEL 501 structure, the opening of the aperture 528 is decreased thereby decreasing the area available for current flow through the VCSEL 501. This in turn increases the electrical impedance of the VCSEL 501. By controlling the electrical impedance of the VCSEL 501, current controls can be used to regulate the heat generated by the VCSEL 501 and therefore the operating temperature of the VCSEL 501.

Linewidth Enhancement Factor Optimization

Figure 6:
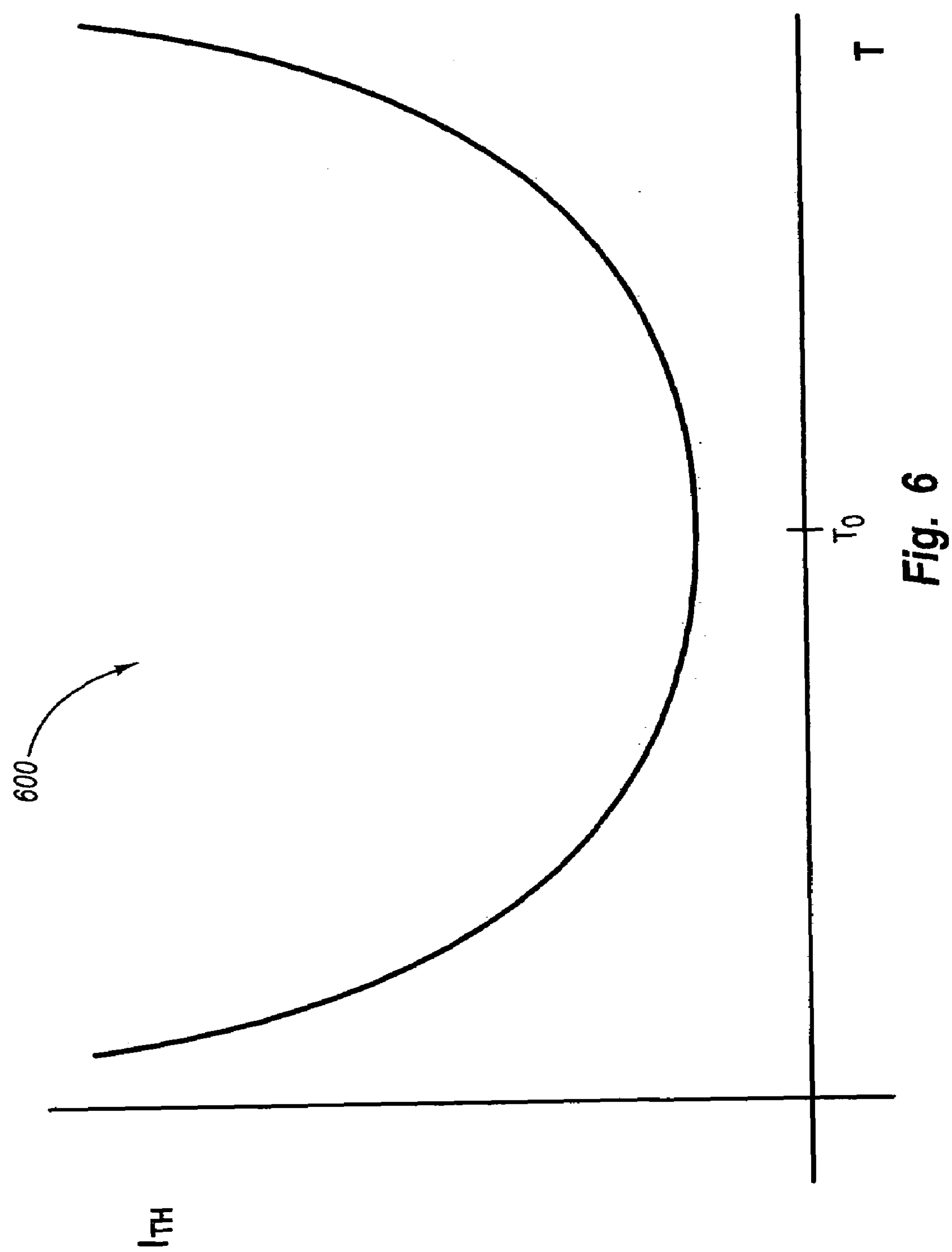
FIG. 6 illustrates a threshold current versus temperature graph useful for illustrating optimizations in linewidth enhancement factor for lasers used in self mixing applications.

One optimization alters the characteristics of the laser so as to change the threshold current versus temperature operating characteristics, which affects the linewidth enhancement factor. Referring now FIG. 6, a curve 600 is shown that illustrates the relationship between the threshold current and the operating temperature of a VCSEL. Shown on the curve 600 is a point $T_0$ where the threshold voltage for the VCSEL is at its lowest value with respect to the temperature. By adjusting $T_0$ to higher values relative to the expected operating temperature, a VCSEL can be optimized for sensitivity in self mixing applications. The linewidth enhancement factor is increased as $T_0$ is moved above the operating temperature.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. An optoelectronic device comprising:
- a VCSEL diode comprising a first PN junction with a first p layer and a first n layer;
- a tunnel diode coupled directly to the VCSEL diode, the tunnel diode comprising a heavily doped n+ layer and a heavily doped p+ layer; and
- a photodiode coupled directly to the tunnel diode, the tunnel diode comprising a second PN junction.

2. The optoelectronic device of claim 1, wherein the second PN junction comprises one of the heavily doped n+ layer and the heavily doped p+ layer.

3. The optoelectronic device of claim 1 wherein the first n layer is attached at the n+ layer.

4. The optoelectronic device of claim 1 wherein the first p layer is attached at the p+ layer.

5. The optoelectronic device of claim 1 further comprising a tunnel junction contact coupled to the n+ layer.

6. The optoelectronic device of claim 1 further comprising a tunnel junction contact coupled to the p+ layer.

7. The optoelectronic device of claim 1, wherein the first PN junction comprises:
- a p type DBR mirror;
- a VCSEL active region coupled to the p type DBR mirror;
- an n type DBR mirror coupled to the VCSEL active region; and
- wherein the p type DBR mirror comprises layers with doping optimized for a more translucent mirror.

8. The optoelectronic device of claim 1 further comprising:
- a first contact coupled to the VCSEL;
- a second contact coupled to the tunnel diode;
- a third contact coupled to the photodiode;
- wherein the contacts are optimized to reduce the thermal mass of the optoelectronic device.

9. The optoelectronic device of claim 1 wherein the VCSEL comprises an active region, the optoelectronic device further comprising a trench about the active region, the trench optimized to reduce the thermal conductivity of the optoelectronic device.

10. The optoelectronic device of claim 9, wherein the trench comprises an optimized radius.

11. The optoelectronic device of claim 1, wherein the tunnel diode comprises an InGaAs superlattice.

12. The optoelectronic device of claim 1, further comprising a dielectric layer disposed on the VCSEL, the dielectric layer being optimized to allow the VCSEL to be more translucent.

13. The optoelectronic device of claim 12, wherein the dielectric layer has a thickness of about $((2n+1)/4)*\lambda$ for n equal to an integer and $\lambda$ equal to the wavelength of design for the VCSEL.

14. The optoelectronic device of claim 1, wherein the first PN junction comprises:

a p type DBR mirror;

a VCSEL active region coupled to the p type DBR mirror;

an n type DBR mirror coupled to the VCSEL active region; and wherein the n type DBR mirror comprises layers of alternating high and low refractive index layers, wherein a plurality of the low refractive index layers near the active region comprise AlGaAs and a plurality of the low refractive index layers further from the active region comprise AlAs and GaAs to optimize the thermal conductivity of the optoelectronic device for use in self mixing applications.

15. The optoelectronic device of claim 1, the VCSEL further comprising a point $T_0$ in a threshold current versus temperature operating characteristics, wherein $T_0$ is adjusted to higher values relative to the expected operating temperature for sensitivity in self-mixing applications.

16. The optoelectronic device of claim 1, the VCSEL further comprising a bottom mirror, the bottom mirror comprising alternating high and low index of refraction layers wherein at least a portion of the alternating layers of the bottom mirror comprise an optimized Ga fraction for reducing spontaneous emissions from reaching the photodiode.

17. A method of making an optoelectronic device, the method comprising:

forming a photodiode on a wafer;

forming a tunnel diode on the photodiode, the tunnel diode being electrically connected to the photodiode; and forming a VCSEL diode on the tunnel diode, the VCSEL diode being electrically connected to the tunnel diode.

18. The method of claim 17, wherein forming a photodiode on a wafer comprises forming an n layer and a p+ layer.

19. The method of claim 18, wherein forming a tunnel diode comprises forming an n+ layer on the p+ layer.

20. The method of claim 19, wherein forming a laser diode comprises forming a laser n layer on the n+ layer and a laser p layer on the p+ layer.

* * * * *

CERTIFICATE OF CORRECTION

PATENT NO. : 7,184,454 B2
APPLICATION NO. : 10/877915
DATED : February 27, 2007
INVENTOR(S) : James Guenter It is certified that error appears in the above-identified patent and that said Letters Patent is hereby corrected as shown below:

Column 5
Line 26, make "100" bolded

Column 6
Line 63, remove "a" after "cavity"

Column 7
Lines 45-46, change "application" to --applications--

Column 8
Line 47, change "devices" to --device's--

Column 9
Line 3, change "524, 522" to --524 and 522--
Line 30, change "100" to --100%--

Signed and Sealed this

Tenth Day of August, 2010

David J. Kappos
*Director of the United States Patent and Trademark Office*